United States Patent [19]

Asghar et al.

[11] Patent Number: 4,994,801
[45] Date of Patent: Feb. 19, 1991

[54] APPARATUS ADAPTABLE FOR USE IN EFFECTING COMMUNICATIONS BETWEEN AN ANALOG DEVICE AND A DIGITAL DEVICE

[75] Inventors: Safdar M. Asghar; John G. Bartkowiak; Miki Z. Moyal, all of Austin, Tex.

[73] Assignee: Advanced Micro Devices, Inc., Sunnyvale, Calif.

[21] Appl. No.: 428,614

[22] Filed: Oct. 30, 1989

[51] Int. Cl.⁵ ................... H03M 1/00; H03M 7/00
[52] U.S. Cl. ............................ 341/110; 341/61; 364/724.01
[58] Field of Search ............... 341/108, 110, 126, 143, 341/144, 155, 61; 364/724.01

[56] References Cited

U.S. PATENT DOCUMENTS

4,020,332  4/1977  Crochiere et al. ............ 364/724.01
4,855,743  8/1989  Hester ............................ 341/110

Primary Examiner—William M. Shoop, Jr.
Assistant Examiner—H. L. Williams
Attorney, Agent, or Firm—Foley & Lardner

[57] ABSTRACT

An apparatus adaptable for use in effecting communications between an analog device and a digital device, having an analog-digital-analog circuit for converting incoming analog signals received from the analog device to incoming digital signals, and for converting interpolated outgoing digital signals to outgoing analog signals. The apparatus further has a digital signal processing circuit for decimating the incoming digital signals and providing a decimated incoming digital signal to the digital device, and for interpolating outgoing digital signals received from the digital device and providing an interpolated outgoing digital signal to the analog-digital-analog device. The analog-digital-analog device includes a single digital-to-analog converter and switches for selectively configuring the analog-digital-analog circuit to effect conversion of incoming analog signals to incoming digital signals or, alternatively, to effect conversion of interpolated outgoing digital signals to outgoing analog signals. The digital signal processing circuit is comprised of a plurality of modules which are configured so that a specified set of the plurality of modules effects a specified number of iterations of decimation and a specified number of iterations of interpolation. Certain of the specified set of modules participate in both the decimation and interpolation operations. The modules are further designed so that additional modules may be added to the specified set of modules to increase the iterations of decimation or to increase the iterations of interpolation, or to increase the iterations of both decimation and interpolation.

16 Claims, 5 Drawing Sheets

Fig. 3

| | $T_0$ | $T_1$ | $T_2$ | $T_3$ | $T_4$ |
|---|---|---|---|---|---|
| R0 | LOAD 64x(n) INTO R0 | LOAD 64x(n) INTO R0 | LOAD 64x(n) INTO R0 | | |
| SA1 { R1A | T0-1 | T1-2 | REPEAT T0-1 | REPEAT T1-2 | REPEAT T0-1 |
| R1B | LOAD PLA INTO R1B R0+R1B=$Y_i(n)$ | LOAD PLA INTO R1B R0+R1B=$Y_i(n+1)$ | LOAD PLA INTO R1B R0+R1B=$Y_i(n+2)$ | | REPEAT T1-2 |
| SA2 R2 | R2+SA1=$Y_i(n)$ +2$Y_i(n-1)$ LEAVE $Y_i(n)$ IN R2 | LOAD R2 WITH SA1 OUTPUT I.E., $Y_i(n+1)$ | R2+SA1=$Y_i(n+2)$ +2$Y_i(n+1)$ LEAVE $Y_i(n+2)$ IN R2 | | |
| SA3 R3 | R3+SA2=$Y_i(n)$ +2$Y_i(n-1)$ +$Y_i(n-2)$ | LOAD R3 WITH OLD R2 I.E., $Y_i(n)$ | R3+SA2=$Y_i(n+2)$ +2$Y_i(n+1)$ +$Y_i(n)$ | | |
| R4 | LOAD R4 WITH SA3 OUTPUT | | LOAD R4 WITH SA3 OUTPUT | | |

APPARATUS ADAPTABLE FOR USE IN EFFECTING COMMUNICATIONS BETWEEN AN ANALOG DEVICE AND A DIGITAL DEVICE

CROSS REFERENCE TO RELATED APPLICATIONS

The following applications contain subject matter similar to the subject matter of this application:

U.S. patent application Ser. No. 434,271, filed Oct. 30, 1989; entitled "Apparatus Having Shared Modular Architecture for Decimation and Interpolation";

U.S. patent application Ser. No. 428,628, filed Oct. 30, 1989; entitled "Apparatus Having a Modular Decimation Architecture";

U.S. patent application Ser. No. 429,207, filed Oct. 30, 1989; entitled "Apparatus Having Modular Interpolation Architecture"; and U.S. patent application Ser. No. 428,629, filed Oct. 30, 1989; entitled "Apparatus Having Shared Architecture for Analog-to-Digital and for Digital-to-Analog Signal Conversion".

BACKGROUND OF THE INVENTION

The present invention is directed to a communications interface apparatus adaptable for use in effecting communications between an analog device and a digital device. Specifically, in its preferred embodiment, the present invention effects communications between a voice-band device, such as a telephone, and a data processing device.

The present invention receives analog signals from a voice-band device, decimates those analog voice-band signals to produce decimated incoming digital signals representative of the received analog voice band signals. The decimated incoming digital signals are recognizable by the data processing device.

The present invention also receives outgoing digital signals from the data processing device, interpolates those outgoing digital signals to produce an interpolated digital signal which is converted to an outgoing analog signal representative of the outgoing digital signal. The outgoing analog signal is recognizable by the analog device.

In the manufacturing of interface devices such as the present invention, it is common that separate duplicate components be utilized for the analog-to-digital conversion circuitry and the digital-to-analog conversion circuitry. It is also common that separate components are used for the decimation of incoming audio signals and for the interpolation of outgoing digital signals. Often there is duplication of components between the decimation circuitry and the interpolation circuitry.

Such use of duplicate components results in several disadvantages. For example, in integrated circuit embodiments, the cost increase occasioned by such component duplication is not significant. However, such duplicate components require additional trimming during manufacture in order that gains, accuracy, and offsets and biases are balanced within the analog-to-digital functional path and within the digital-to-analog functional path.

Another disadvantage is that the use of duplicate components necessarily requires that a greater chip area be occupied. Thus, the smallness of a chip implementation of such a device is inherently limited by the necessity to duplicate components to effect the two functions required.

The present invention is designed to overcome some of the shortcomings of duplicate-component interface apparata for use in effecting communications between analog and digital devices.

SUMMARY OF THE INVENTION

The invention is an apparatus adaptable for use in effecting communications between an analog device and a digital device, having an analog-digital-analog circuit for converting incoming analog signals received from the analog device to incoming digital signals, and for converting interpolated outgoing digital signals to outgoing analog signals. The apparatus further has a digital signal processing circuit for decimating the incoming digital signals and providing a decimated incoming digital signal to the digital device, and for interpolating outgoing digital signals received from the digital device and providing an interpolated outgoing digital signal to the analog-digital-analog device.

The analog-digital-analog device includes a single digital-to-analog converter and switches for selectively configuring the analog-digital-analog circuit to effect conversion of incoming analog signals to incoming digital signals or, alternatively, to effect conversion of interpolated outgoing digital signals to outgoing analog signals.

The digital signal processing circuit is comprised of a plurality of modules which are configured so that a specified set of the plurality of modules effects a specified number of iterations of decimation and a specified number of iterations of interpolation. Certain of the specified set of modules participate in both the decimation and interpolation operations.

The modules are further designed so that additional modules may be added to the specified set of modules to increase the iterations of decimation or to increase the iterations of interpolation, or to increase the iterations of both decimation and interpolation.

It is, therefore, an object of this invention to provide an apparatus adaptable for use in effecting communications between an analog device and a digital device which is configured to share components in both analog-to-digital conversion functions as well as digital-to-analog conversion functions.

A further object of this invention is to provide an apparatus adaptable for use in effecting communications between an analog device and a digital device, the manufacture of which may be accomplished with economies of component trimming and chip area.

Still a further object of this invention is to provide an apparatus adaptable for use in effecting communications between an analog device and a digital device which is inexpensive to construct.

Further objects and features of the present invention will be apparent from the following specification and claims when considered in connection with the accompanying drawings illustrating the preferred embodiment of the invention.

DETAILED DESCRIPTION OF THE INVENTION

Figure 1:
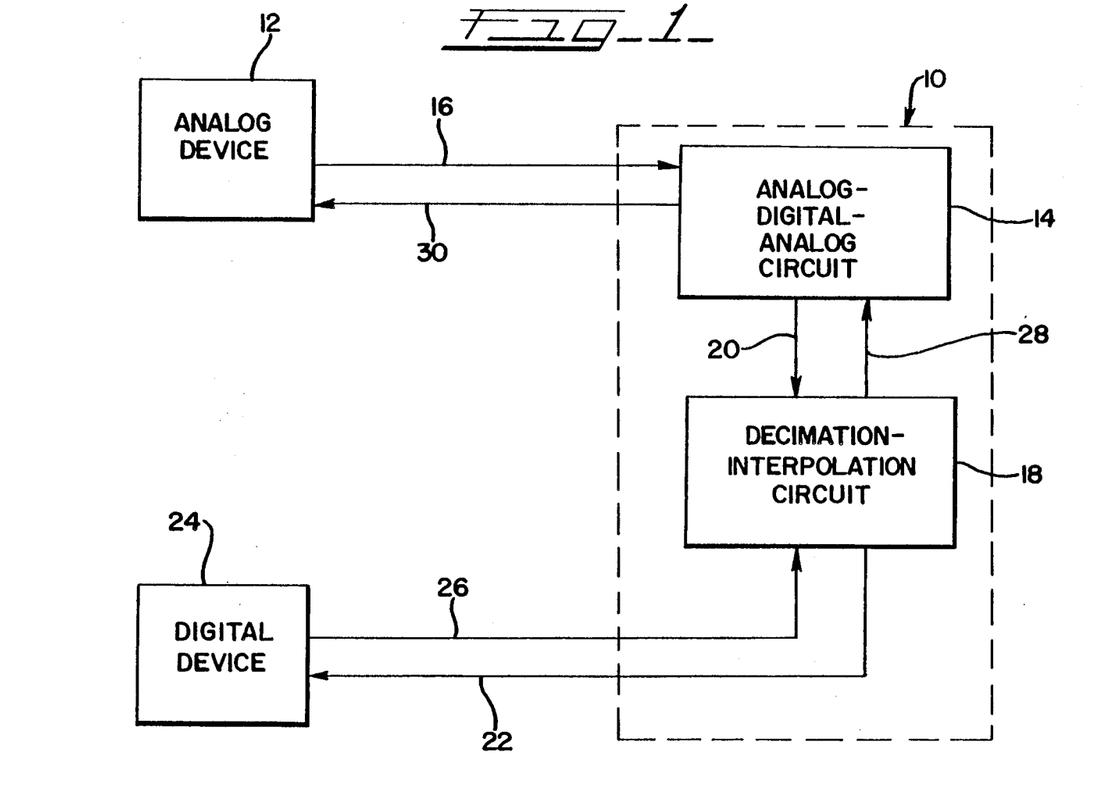
FIG. 1 is a schematic system block diagram of the preferred embodiment of the present invention.

The preferred embodiment of a communications interface apparatus 10 is illustrated in a schematic system block diagram in FIG. 1.

In FIG. 1, an analog device 12, such as a telephone voice instrument, is connected to an analog-digital-analog circuit 14 within the communications interface apparatus 10. Typically, the analog device 12 operates in the audio frequency range, approximately 300 Hz to 3.4 KHz. The analog-digital-analog circuit 14 samples the incoming analog signal which is conveyed from the analog device 12 via line 16. The sample rate of the analog-digital-analog circuit 14 is, in the preferred embodiment, approximately 2 MHz. Some advantages are incurred by the high frequency sampling by the analog-digital-analog circuit 14: for example, a higher frequency of operation allows for closer spacing of components in the communications interface apparatus 10 when the communications interface apparatus 10 is configured as an integrated circuit, i.e., a silicon chip construction; and the high frequency sampling allows for a more accurate digital representation of the incoming analog signal.

The analog-digital-analog circuit 14 converts the incoming analog signal received on line 16 to an incoming digital signal and conveys that incoming digital signal to a decimation-interpolation circuit 18 via line 20. The decimation-interpolation circuit 18 receives the incoming digital signal on line 20, performs a decimation operation upon that signal, and outputs a decimated incoming digital signal on line 22. In the preferred embodiment, the incoming decimated digital signal is produced at a frequency of approximately 16 KHz, a frequency which still allows for obtaining the advantages of high frequency close spacing of components in a silicon chip structure and high resolution of the digital representation of the incoming analog signal. The incoming decimated digital signal is presented to the digital device 24 via line 22. The digital device 24 is, commonly, a device such as a data processing device or a computerized communications switching apparatus.

The digital device 24 provides outgoing digital signals to the decimation-interpolation circuit 18 via line 26. The decimation-interpolation circuit 18 performs an interpolation operation upon the outgoing digital signals received on line 26 and outputs interpolated digital signals via line 28 to the analog-digital-analog circuit 14. The analog-digital-analog circuit 14 receives the interpolated digital signals on line 28, converts those interpolated digital signals to outgoing analog signals, and provides the outgoing analog signals to the analog device 12 via line 30.

Figure 2:
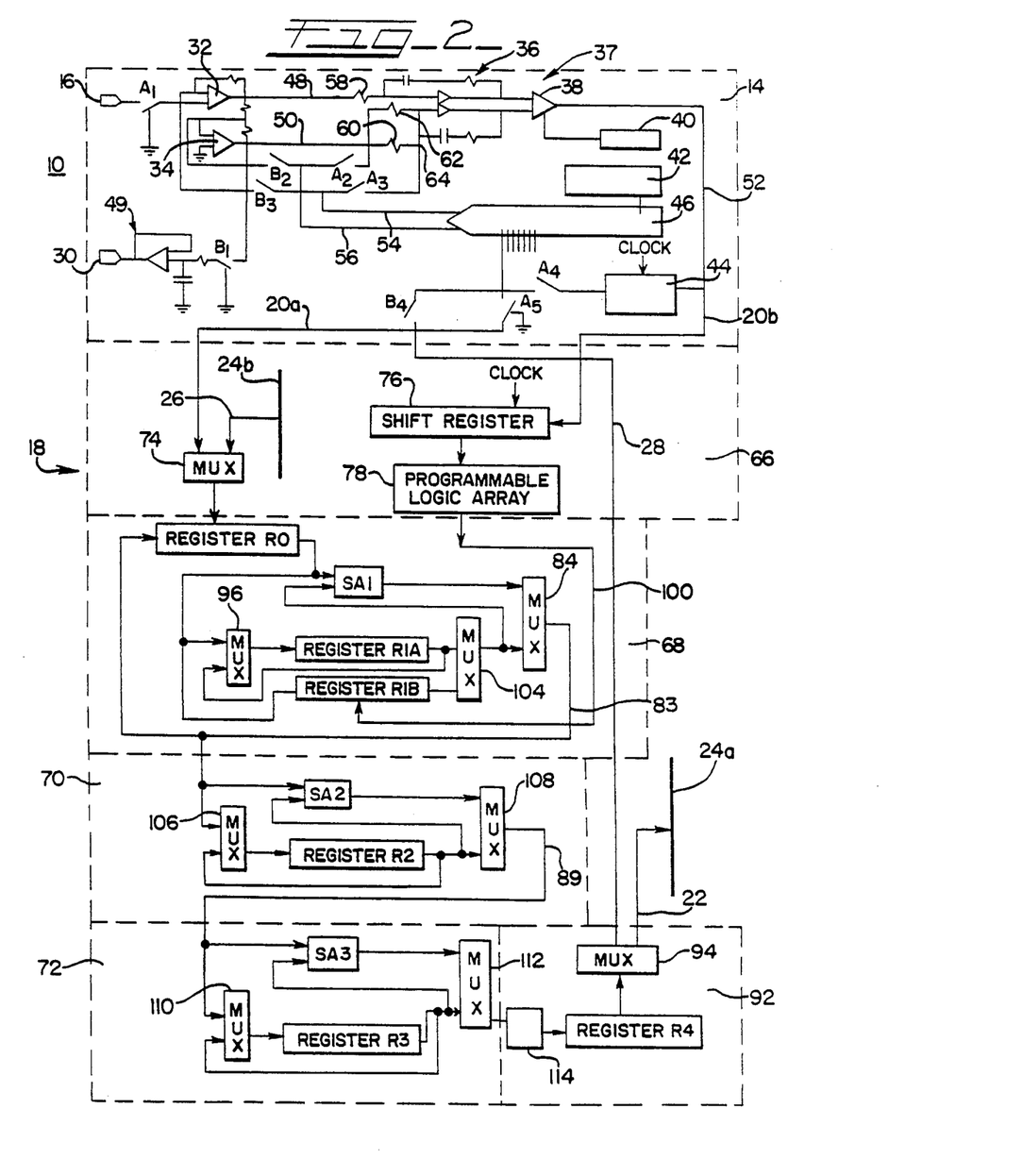
FIG. 2 is an electrical schematic diagram of the preferred embodiment of the present invention.

An electrical schematic diagram of the preferred embodiment of a communications interface apparatus 10 is presented in FIG. 2.

For purposes of clarity in describing the preferred embodiment of the present invention, like elements will be labelled with like reference numerals throughout this description.

In FIG. 2, an analog-digital-analog circuit 14 receives incoming analog signals on line 16 from an analog device (not shown in FIG. 2) and outputs outgoing digital signals on line 30. Further, the analog-digital-analog circuit 14 conveys incoming digital signals to a decimation-interpolation circuit 18 via lines 20a and 20b and receives interpolated digital signals from the decimation-interpolation circuit 18 via line 28.

The decimation-interpolation circuit 18 is preferably comprised of digital input circuit 66, first digital cell circuit 68, second digital cell circuit 70, second digital cell circuit 72, and output circuit 92.

The first digital cell circuit 68 is preferably comprised of a shift register R0 receiving an input from multiplexer 74 and providing an output to a one bit adder SA1, a multiplexer 96, and a shift register R1B. The output of the programmable logic array 78 is applied to shift register R1B via line 100. The output of multiplexer 96 is applied to a shift register R1A. The output of shift register R1A is applied to a multiplexer 104 as well as fed back to the multiplexer 96. Also applied to the multiplexer 104 is the output of shift register R1B. The output of multiplexer 104 is applied to multiplexer 84 as well as to one bit adder SA1. The output of multiplexer 84, which is also the output of first digital cell circuit 68, is applied to one bit adder SA2 of second digital cell circuit 70 as well as to shift register R0. Second digital cell circuit 70 further comprises a multiplexer 106 which also receives the output of multiplexer 84. The output of shift register R2 is applied to multiplexer 108 as well as fed back to multiplexer 106 and applied to one bit adder SA2. Also provided to multiplexer 108 is the output of one bit adder SA2. The output of multiplexer 108, which is also the output of second digital cell circuit 70, is applied to one bit adder SA3 and multiplexer 110 of second digital cell circuit 72. Further in second digital cell circuit 72, the output of one bit adder SA3 is applied to multiplexer 112 and the output of multiplexer 110 is applied to shift register R3. The output of shift register R3 is applied to multiplexer 112, to one bit adder SA3, and to multiplexer 110. The output of multiplexer 112, which is also the output of second digital cell circuit 72, is applied to output circuit 92.

Specifically, the output of multiplexer 112 is applied to scaling subcircuit 114 which applies a scaled output to shift register R4. The output of shift register R4 is provided via multiplexer 94 to input bus 24a via line 22.

The decimation-interpolation circuit 18 conveys decimated incoming digital signals to the input bus 24a of a digital device (only the input bus 24a and the output bus 24b of the digital device 24 are illustrated in FIG. 2) via line 22.

The decimation-interpolation circuit 18 receives outgoing digital signals from the digital device output bus 24b via line 26, and conveys interpolated digital signals, as previously described, to the analog-digital-analog circuit 14 via line 28. The analog-digital-analog circuit 14 conveys outgoing analog signals to an analog device (not shown in FIG. 2) via line 30.

The analog-digital-analog circuit 14, as illustrated in FIG. 2, includes operational amplifiers 32 and 34, integrator 36, comparator 38, clock 40, voltage/current reference source 42, counter 44, digital-to-analog converter 46, and output filter 48. Also, as illustrated in FIG. 2, the analog-digital-analog circuit 14 includes two groups of switches: a first group of switches labelled $A_1$, $A_2$, $A_3$, $A_4$, and $A_5$; and a second group of switches labelled $B_1$, $B_2$, $B_3$, and $B_4$. The settings of the A and B groups of switches determine the function performed by the analog-digital-analog circuit 14, as shall be described in greater detail below.

When the analog-digital-analog circuit 14 is configured for analog-to-digital conversion in order that incoming analog signals received at line 16 may be converted to representative digital signals and presented as incoming digital signals at lines 20A and 20B, the A-group of switches (switches $A_1$-$A_5$) are closed and the B-group of switches (switches $B_1$-$B_4$) are open. In such an orientation, positive portions of incoming analog signals are amplified by operation amplifier 32 and negative portions of incoming analog signals are amplified by operation amplifier 34. That is, the operation amplifiers 32 and 34 are configured, with the A-group of switches closed and the B-group of switches open, as voltage followers so that signals are present on line 48 representing positive values of voltages received via line 16, and signals are present on line 50 representing negative values of voltages received via line 16.

Before proceeding further, it is useful to note that a feedback circuit is established within the analog-digital-analog circuit 14: the output of the comparator 38 on the line 52, through the counter 44, through switch $A_4$, through the digital-to-analog converter 46. The digital-to-analog converter 46 produces a negative current output at line 54 and a positive current output at line 56, the negative and positive current outputs are representative of the digital signals which comprise the output of the comparator 38 on the line 52.

Thus, the output of the comparator 38 is fed back to the input of the integrator 36 after conversion to analog form. The voltages present at line 48 pass through resistor 58 in order that current signals representing positive values of voltages received via line 16 and current signals representing positive values of the digital output of comparator 38 are present at juncture 62. Further, the voltages present at line 50 pass through resistor 60 in order that current signals representing negative values of voltages received via line 16 and current signals representing negative values of the digital output of comparator 38 are present at juncture 64. The integrator 36 and the comparator 38 form a sigma-delta modulator 37. Thus, the sigma-delta modulator 37 compares present and past positive representations of the incoming analog signal, and present and past negative representations of the incoming analog signal. The sigma-delta modulator 37, driven by the clock 40, operates in a manner whereby the output of the comparator 38, which appears at line 52, is a digital signal indicating a plus or a minus step signal, depending upon whether the feedback signals from lines 54 and 56 are greater than or less than the respective incoming analog signals appearing at junctures 62 and 64.

The analog-digital-analog circuit 14, thus configured for analog-to-digital conversion, seeks to match the current representations of the output of the comparator 38, which appear at lines 54 and 56, with the current representations of the incoming analog signal appearing at junctures 62 and 64. The analog-digital-analog circuit 14, in the preferred embodiment of its analog-to-digital conversion configuration, allows only one-step correction per sample to seek to equalize the output of the comparator 38 and the input of the integrator 36.

When the analog-digital-analog circuit 14 is configured for digital-to-analog conversion in order that interpolated digital signals received via line 28 from the decimation-interpolation circuit 18, the B-group of switches (switches $B_1$-$B_4$) are closed and the A-group of switches (switches $A_1$-$A_5$) are open. In such an orientation, the counter 44 is effectively excluded from the analog-digital-analog circuit 14. The interpolated digital signals are applied via line 28 directly to the digital-to-analog converter 46. The output lines 54 and 56 of the digital-to-analog converter 46 are connected to operational amplifiers 32 and 34 in a manner whereby operational amplifiers 32 and 34 act as current-to-voltage converters. The outputs of operational amplifiers 32 and 34 pass through output filter 49 and are presented at line 30 as outgoing analog signals for use by an analog device (not shown in FIG. 2).

The decimation-interpolation circuit 18, when it receives an incoming digital signal from the analog-digital-analog circuit 14 via lines 20a and 20b, decimates the incoming digital signal in a manner to be described in greater detail below. Further, when the decimation-interpolation circuit 18 receives an outgoing digital signal from digital input bus 24b, it interpolates the outgoing digital signal to produce an interpolated digital signal and provide that interpolated digital signal to the analog-digital-analog circuit 14 via line 28, as will also be described in greater detail below.

The digital input circuit 66 is preferably comprised of a multiplexer 74, a shift register 76, and a programmable logic array 78. When the analog-digital-analog circuit 14 is configured for analog-to-digital conversion (the A-group of switches is closed and the B-group of switches is open), the decimation-interpolation circuit 18 is appropriately clocked to decimate incoming digital signals from the analog-digital-analog circuit 14.

As each succeeding digital pulse output of comparator 38 is applied to line 52, each such succeeding pulse is applied to the digital input circuit 66 at two points. The current count output of the analog-digital-analog circuit 14 is applied via line 20a to the multiplexer 74, and the shift register 76 receives and stores a history of the pulse signals which appear on line 52. The structure of the digital input circuit 66 is particularly adapted to the step-wise up and down signalling characteristic of the output of the analog-digital-analog circuit 14 wherein steps up and down are of a predetermined amount for each clock cycle. Such a structure saves hardware and saves having the decimation-interpolation circuit operate at high speed.

For purposes of illustration, the preferred embodiment of the present invention illustrated in FIG. 2 accomplishes a decimation by a factor of 16 implemented in a four stage structure which implements the following transfer function:

$$1/256(1+z^{-1})^2(1+z^{-2})^2(1+z^{-4})^2(1+z^{-8})^2 = H_D(z) \qquad (1)$$

For example, for a sampling rate by the analog-digital-analog circuit 14 of 2.048 MHz, the decimator output would be 128 KHz. For purposes of this illustrative example, it is assumed that the digital-analog converter 46 employed in the analog-digital-analog circuit 14 is a 6-bit converter and that the sigma-delta modulator 37 comprised of the integrator 36 and the comparator 38 is of a first order type. Of course, this implementation can be used for larger digital analog converters and for higher order sigma-delta modulators.

The architecture of the decimation-interpolation circuit 18 requires that the transfer function of Equation (1) be partitioned so that the second digital cell circuit 72 is preceded by all other sections of the decimation-interpolation circuit 18 (i.e., digital input circuit 66, first digital cell circuit 68, and second digital cell circuit 70) to form a transfer function:

$$H_D(z) = 1/256[H_{1D}(z) * H_{2D}(z)] \quad (2)$$

where $H_{2D}(z)$ is implemented in the first digital cell circuit 70 and second digital cell circuit 72, i.e., $(1+z^{-8})^2$ in Equation (1). The factor 1/256 is a scaling factor.

Therefore, transforming Equation (1) into Equation (2) yields:

$$H_D(z) = 1/256[(1+z^{-1})^2(1+z^{-2})^2(1+z^{-4})^2](1+z^{-8})^2 \quad (3)$$

The term within the brackets [ ] of Equation (3) may be expanded to produce the following:

$$\begin{aligned}H_D(z) &= 1/256\ [1 + 2z^{-1} + 3z^{-2} + 4z^{-3} + \\ &\quad 5z^{-4} + 6z^{-5} + 7z^{-6} + 8z^{-7} + 7z^{-8} + \\ &\quad 6z^{-9} + 5z^{-10} + 4z^{-11} + \\ &\quad 3z^{-12} + 2z^{-13} + z^{-14}]\end{aligned} \quad (4)$$

And:

$$H_{2D}(z) = [1 + 2z^{-8} + z^{-16}] \quad (5)$$

The annotation $z^{-m}$ indicates the value of z, m time periods past.

By this partitioning method, $H_{1D}(z)$ may be implemented in the programmable logic array 78 and the first digital cell circuit 68 and $H_{2D}(z)$ may be implemented in the second digital cell circuit 70, and the second digital cell circuit 72.

The time-domain implementation of Equation (4) is:

$$y_1(n) = x(n) + 2x(n-1) + 3x(n-2) + \ldots + x(n-14) \quad (6)$$

Since the sigma-delta modulator 37 comprised of the integrator 36 and the comparator 38 employs a first order scheme, the difference, defined as $d_i$, between successive counter values can only be $\pm 1$, i.e., $x(n-1)$, can only differ from $x(n)$ by $\pm 1$, $x(n-2)$ can only differ from $x(n-1)$ by $\pm 1$, and so on.

Therefore the time-domain implementation of Equation (6) can be expressed as:

$$\begin{aligned}y_1(n) &= x(n) + 2[x(n) - d_1] + 3[x(n) - d_2 - d_3] + \\ &\quad \ldots + [x(n) - d_1 - d_2 \pm \ldots - d_{14}]\end{aligned} \quad (7)$$

where $d_i = \pm 1$, for $i = 1, 2, \ldots, 14$.

Expanding Equation 7 yields:

$$y_1(n) = 64x(n) - 63d_1 - 61d_2 - 58d_3 - 54d_4 - \quad (8)$$

-continued
$$49d_5 - 43d_6 - 36d_7 - 28d_8 - 21d_9 - 15d_{10} - 10d_{11} - $$
$$6d_{12} - 3d_{13} - d_{14}$$

The factors $d_i$ are representative of the successive outputs $D_i$ of comparator 38 which control the incrementing or decrementing of the counter 44. The outputs $D_i$ are successively shifted in shift register 76 and are used as an address to the programmable logic array 78. The address is $D_{14} \ldots D_1$ and comprises a succession of 1's and 0's, "1" meaning count up ($d_i = +1$) and "0" meaning count down ($d_i = -1$).

By substituting all of the possible combinations of $d_{14}, \ldots d_1$, (i.e., $2^{13}$ combinations) where $d_i = +1$ or $-1$ for $i = 1, \ldots, 14$ into Equation (8), one could determine the contents of the programmable logic array 78. For example, for the address:

| $D_{14}$ | $D_{13}$ | $D_{12}$ | $D_{11}$ | $D_{10}$ | $D_9$ | $D_8$ | $D_7$ | $D_6$ | $D_5$ | $D_4$ | $D_3$ | $D_2$ | $D_1$ |
|---|---|---|---|---|---|---|---|---|---|---|---|---|---|
| 0 | 0 | 0 | 0 | 0 | 0 | 0 | 0 | 0 | 0 | 0 | 0 | 0 | 0 |

Successive outputs for the analog-digital-analog circuit 14 are all 0, which forces the counter 44 to decrement. Substituting $d_{14}, \ldots d_1 = -1$ in Equation (8) yields:

$$y_1(n) = 64x(n) + 448 \quad (9)$$

Thus, for the preferred embodiment illustrated in FIG. 2, the programmable logic array 78, with an input address of $0 \ldots 0$, would yield an output value of $+448$. This result indicates that $y_1(n)$ is the sum of $x(n)$, the present sample (provided to the shift register R0 via multiplexer 74), plus the sum of all the previous 14 samples.

It is preferred that the output of the digital input circuit 66 be divided by 8. Consequently, every 8 clocks of the shift register 76, which holds the programmable logic array 78 address, is followed by a load of the counter 44 into shift register R0 via the multiplexer 74, with six zeroes added to the least significant end of the analog-digital-analog circuit 14 output to produce 64 times $x(n)$ (the first term of Equation (8)). The remaining terms of Equation (8) are calculated by the programmable logic array 78 and are loaded into register R1B at the same instant in time as shift register R0 is loaded.

The terms of Equation (8) are added using the bit serial adder SA1 in the first digital cell circuit 68 to determine the value of $H_{1D}(z)$.

The time-domain implementation of $H_{2D}(z)$ is:

$$y_2(n) = y_1(n) + 2y_1(n-1) + y_1(n-2) \quad (10)$$

In the time domain, $H_{1D}(z)$ is an input used in calculating $H_{2D}(z)$. Thus, effectively, the time-domain output $y_2(n)$ is the time-domain result of the total transfer function $H_D(z)$.

The second digital cell circuits 70, 72 produce another decimation of $\div 2$ to give an overall reduction in sampling rate of 16. The next successive expression of $H_{2D}(z)$ is:

$$y_2(n+1) = y_1(n+2) + 2y_1(n+1) + y_1(n) \quad (11)$$

A comparison of Equations (10) and (11) clearly illustrates that successive samples (i.e., input values to $H_{2D}(z))$ are shifted up by two places each clock cycle to produce the decimation by a factor of ÷2.

Figure 3:
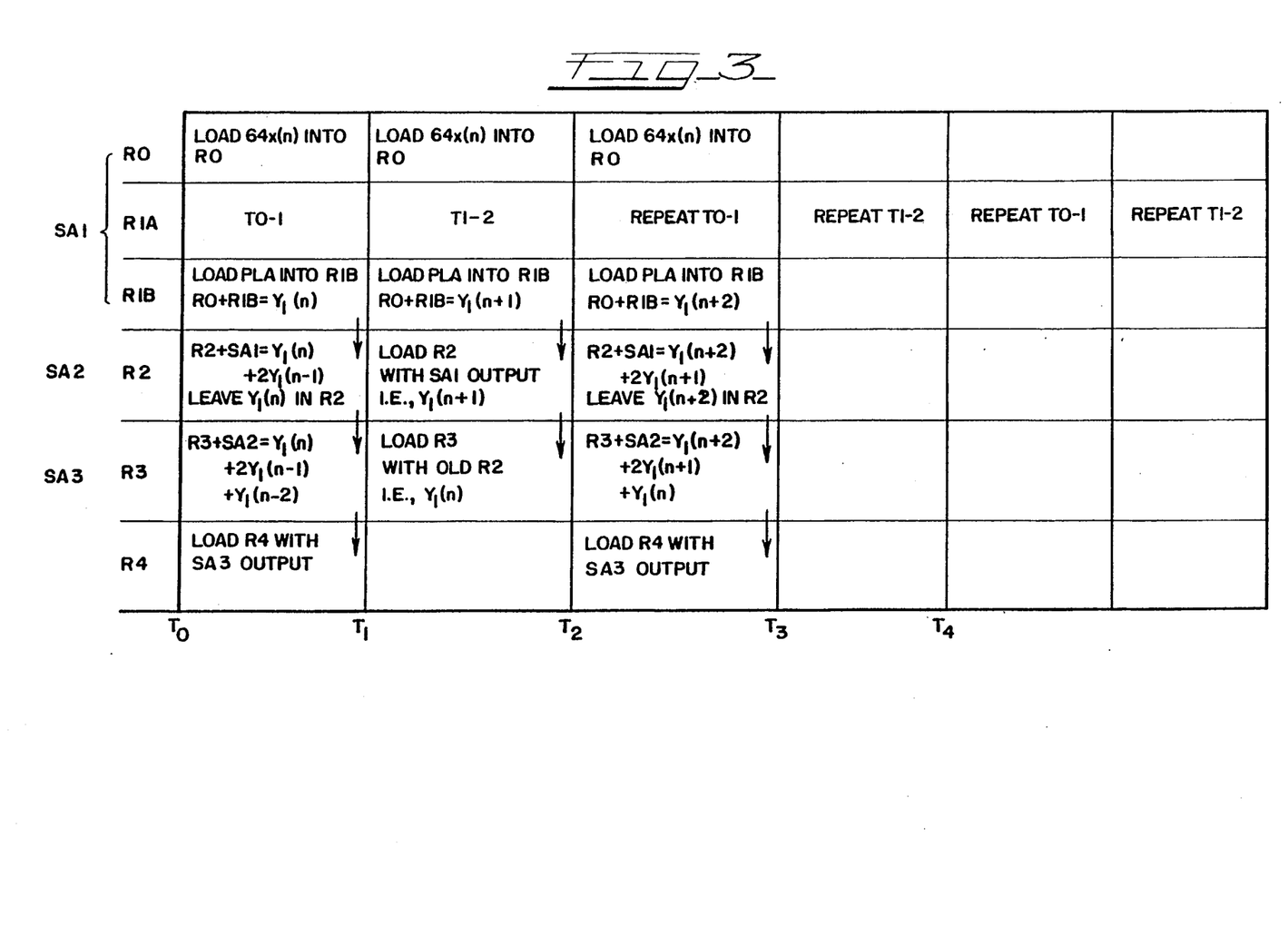
FIG. 3 is a space-time domain matrix representation of the decimation-interpolation circuit of the present invention for implementation of the decimation transfer function.

The first digital cell circuit 68, the second digital cell circuit 70, and the second digital cell circuit 72 implement the $H_D(z)$ transfer function as illustrated in FIG. 3.

Referring to FIG. 3, columnar divisions of a matrix are delineated $T_0, T_1, T_2, \ldots$ to indicate successive time periods, each period being eight clock pulses in duration. Row divisions are representative of the various registers R0, R1A, R1B, R2, R3, and R4 and their associated serial adders SA1, SA2, and SA3 within the decimation-interpolation circuit 18.

Accordingly, each box in the matrix of FIG. 3 represents the function(s) performed by a specific register and serial adder during a specific time period.

As illustrated in FIG. 3, during the time period $T_0$-$T_1$, the quantity 64x(n) is loaded into register R0. Also, first digital cell circuit 68, second digital cell circuit 70, and second digital cell circuit 72 are triggered; the output of the programmable logic array 78 is loaded into register R1B and the contents of register R0 and register R1B are added to yield the quantity $y_1(n)$. Further during the time period $T_0$-$T_1$, the quantity $y_1(n)$ is added with the contents of register R2 by one bit adder SA2 to yield the quantity $y_1(n)+2y_1(n-1)$, using a scaling function provided by appropriate timing. Still within the time period $T_0$-$T_1$, the quantity $y_1(n)+2y_1(n-1)$ is shifted to second digital cell circuit 72 and combined with the then-residing contents of register R3 using one bit adder SA3 to yield the result $y_1(n)+2y_1(n-1)+y_1(n-2)$. The quantity $y_1(n)$ remains in register R2. Finally, within the period $T_0$-$T_1$, the quantity $y_1(n) +2y_1(n-1)+y_1(n-2)$ is shifted into register R4 in the output circuit 92 in scaled format, i.e., ÷256.

During the second eight clock pulse period, $T_1$-$T_2$, the quantity 64x(n) is again loaded into register R0, first digital cell circuit 68 is triggered and its output is loaded into register R2, and the contents of register R2 are loaded into register R3. The programmable logic array 78 contents are loaded into register R1B and the quantity $y_1(n+1)$ is calculated by serial bit adder SA1, combining the contents of register R0 and register R1B. Thus, register R2 now contains $y_1(n+1)$ and register R3 now contains $y_1(n)$.

During the third eight clock pulse period, $T_2$-$T_3$, the first digital cell circuit 68, the second digital cell circuit 70, and the second digital cell circuit 72 are triggered and the output of the programmable logic array 78 is combined with the 64x(n) information concurrently loaded into register R0 to produce the quantity $y_1(n+2)$. Serial adder SA2 computes the quantity $y_1(n+2)+2y_1(n+1)$ and register R2 retains the quantity $y_1(n+2)$ in storage. Serial adder SA3 calculates the quantity $y_1(n+2)+2y_1(n+1)+y_1(n)$. The output of serial adder SA3 is then loaded into register R4 and the output which was previously loaded into register R4 during time period $T_0$-$T_1$ is transferred to input bus 24a via line 22.

Thus, during the time period $T_0$-$T_1$, a first value of $H_{2D}(z)$ in the form of Equation (10) was loaded into register R4, i.e., $y_1(n)+2y_1(n-1) +y_1(n-2)$. During the time period $T_2$-$T_3$, there is loaded into register R4 the next successive expression of $H_{2D}(z)$ in the form of Equation (11), i.e., $y_1(n+2)+2y_1(n+1)+y_1(n)$, and the first value of $H_{2D}(z)$ is clocked through the multiplexer 94 of output circuit 92 to input bus 24a via line 22.

When the analog-digital-analog circuit 14 is configured for digital-to-analog conversion (i.e., the A-group of switches is open and the B-group of switches is closed), the decimation-interpolation circuit 18 is appropriately clocked to interpolate digital signals received from output bus 24b. Interpolation is preferably effected using a four stage structure having a transfer function of the form:

$$1/256(1+z^{-1})^2(1+z^{-2})^2(1+z^{-4})^2(1+z^{-8})^2 = H_I(z) \quad (12)$$

Equation (12) can be realized as four cascaded blocks of the form $H_{jI}(z)$ where:

$$H_I(z) = [H_{1I}(z) * H_{2I}(z) * H_{3I}(z) * H_{4I}(z)] \quad (13)$$
where $H_{1I}(z) = \tfrac{1}{4}(1 + 2z^{-1} + z^{-2})$,
$H_{2I}(z) = \tfrac{1}{4}(1 + 2z^{-2} + z^{-4})$, etc.

for each of the terms in equation (12).

For example, with a sampling rate of 16 KHz at the input of multiplexer 74, the output frequency of the interpolated digital signal is 256 KHz (i.e., x 16).

When interpolating by a factor of 2, using the transfer function of Equation (13), zeroes are inserted into the time-domain implementation between successive samples so that the output is at twice the input rate.

The time-domain implementation of this interpolation is represented by:

$$y_I(n) = \tfrac{1}{4}[x(n)+2x(n-1)+x(n-2)] \quad (14)$$

where the alternate samples are zeroes so that the samples $x(n-2), x(n-1), x(n)$ become:

$$x(n-2), 0, x(n-1), 0, x(n), 0, x(n+1) \quad (15)$$

The four stage interpolator is therefore implemented as:

Thus, by way of illustration, in the first ($I_1$) stage, $I_{10}(n-1)$ equals:

$$I_{10}(n-1) = \tfrac{1}{2}[x(n-1)+0+x(n-2)] \quad (16)$$

and:

$$I_{11}(n-1) = \tfrac{1}{2}[0+2x(n-1)+0] \quad (17)$$

The scaling factor has been adjusted to one-half to compensate for the inserted zeroes.

Interpolation factor implementation functions hereinafter will, for the sake of clarity, be designated in the form: $I_{abbbb\ldots}(n)$, where "a" indicates the interpolator stage involved (a=1, 2, 3, 4), and "bbbb . . ." indicates successive interpolation factors.

Thus, through the zero-insertion operation described above, each interpolator stage ($I_1, I_2, I_3, I_4$) generates two time-domain implementations for each input. Interpolator stage $I_4$, therefore, will generate sixteen time-domain interpolation factors.

For example, interpolator stage $I_1$ will generate:

$$I_{10}(n) = \tfrac{1}{2}[x(n) + x(n-1)]; \text{ and} \quad (18)$$
$$I_{11}(n) = \tfrac{1}{2}[2x(n)] \quad (19)$$

Thus, for one stage of the interpolator where, for example, sample x(n) arrives, the block $I_1$ outputs twice before x(n+1) arrives where the two outputs are of the form of Equations (18) and (19).

The entire interpolation chain can then be generated for one input sample x(n) to produce 16 output samples, as illustrated below:

| $I_{10}(n)$ | $I_{200}(n)$ | $I_{3000}(n)$ | $I_{40000}(n)$ |
|---|---|---|---|
|  |  |  | $I_{40001}(n)$ |
|  |  | $I_{3001}(n)$ | $I_{40010}(n)$ |
|  |  |  | $I_{40011}(n)$ |
|  | $I_{201}(n)$ | $I_{3010}(n)$ | $I_{40100}(n)$ |
|  |  |  | $I_{40101}(n)$ |
|  |  | $I_{3011}(n)$ | $I_{40110}(n)$ |
|  |  |  | $I_{40111}(n)$ |
| $I_{11}(n)$ | $I_{210}(n)$ | $I_{3100}(n)$ | $I_{41000}(n)$ |
|  |  |  | $I_{41001}(n)$ |
|  |  | $I_{3101}(n)$ | $I_{41010}(n)$ |
|  |  |  | $I_{41011}(n)$ |
|  | $I_{211}(n)$ | $I_{3110}(n)$ | $I_{41100}(n)$ |
|  |  |  | $I_{41101}(n)$ |
|  |  | $I_{3111}(n)$ | $I_{41110}(n)$ |
|  |  |  | $I_{41111}(n)$ | where

| | | |
|---|---|---|
| $I_{10}(n)$ | = | $\frac{1}{2}(x(n) + x(n-1))$ |
| $I_{11}(n)$ | = | $x(n)$ |
| $I_{200}(n)$ | = | $\frac{1}{2}(I_{10}(n) + I_{11}(n-1))$ |
| $I_{201}(n)$ | = | $I_{10}(n)$ |
| $I_{210}(n)$ | = | $\frac{1}{2}(I_{10}(n) + I_{11}(n))$ |
| $I_{211}(n)$ | = | $I_{11}(n)$ |
| $I_{3000}(n)$ | = | $\frac{1}{2}(I_{200}(n) + I_{211}(n-1))$ |
| $I_{3001}(n)$ | = | $I_{200}(n)$ |
| $I_{3010}(n)$ | = | $\frac{1}{2}(I_{200}(n) + I_{201}(n))$ |
| $I_{3011}(n)$ | = | $I_{201}(n)$ |
| $I_{3100}(n)$ | = | $\frac{1}{2}(I_{201}(n) + I_{210}(n))$ |
| $I_{3101}(n)$ | = | $I_{210}(n)$ |
| $I_{3110}(n)$ | = | $\frac{1}{2}(I_{210}(n) + I_{211}(n))$ |
| $I_{3111}(n)$ | = | $I_{211}(n)$ |
| $I_{40000}(n)$ | = | $\frac{1}{2}(I_{3000}(n) + I_{3111}(n-1))$ |
| $I_{40001}(n)$ | = | $I_{3000}(n)$ |
| $I_{40010}(n)$ | = | $\frac{1}{2}(I_{3000}(n) + I_{3001}(n))$ |
| $I_{40011}(n)$ | = | $I_{3001}(n)$ |
| $I_{40100}(n)$ | = | $\frac{1}{2}(I_{3001}(n) + I_{3010}(n))$ |
| $I_{40101}(n)$ | = | $I_{3010}(n)$ |
| $I_{40110}(n)$ | = | $\frac{1}{2}(I_{3010}(n) + I_{3011}(n))$ |
| $I_{40111}(n)$ | = | $I_{3011}(n)$ |
| $I_{41000}(n)$ | = | $\frac{1}{2}(I_{3011}(n) + I_{3100}(n))$ |
| $I_{41001}(n)$ | = | $I_{3100}(n)$ |
| $I_{41010}(n)$ | = | $\frac{1}{2}(I_{3100}(n) + I_{3101}(n))$ |
| $I_{41011}(n)$ | = | $I_{3101}(n)$ |
| $I_{41100}(n)$ | = | $\frac{1}{2}(I_{3101}(n) + I_{3110}(n))$ |
| $I_{41101}(n)$ | = | $I_{3110}(n)$ |
| $I_{41110}(n)$ | = | $\frac{1}{2}(I_{3110}(n) + I_{3111}(n))$ |
| $I_{41111}(n)$ | = | $I_{3111}(n)$ |

Figure 4:
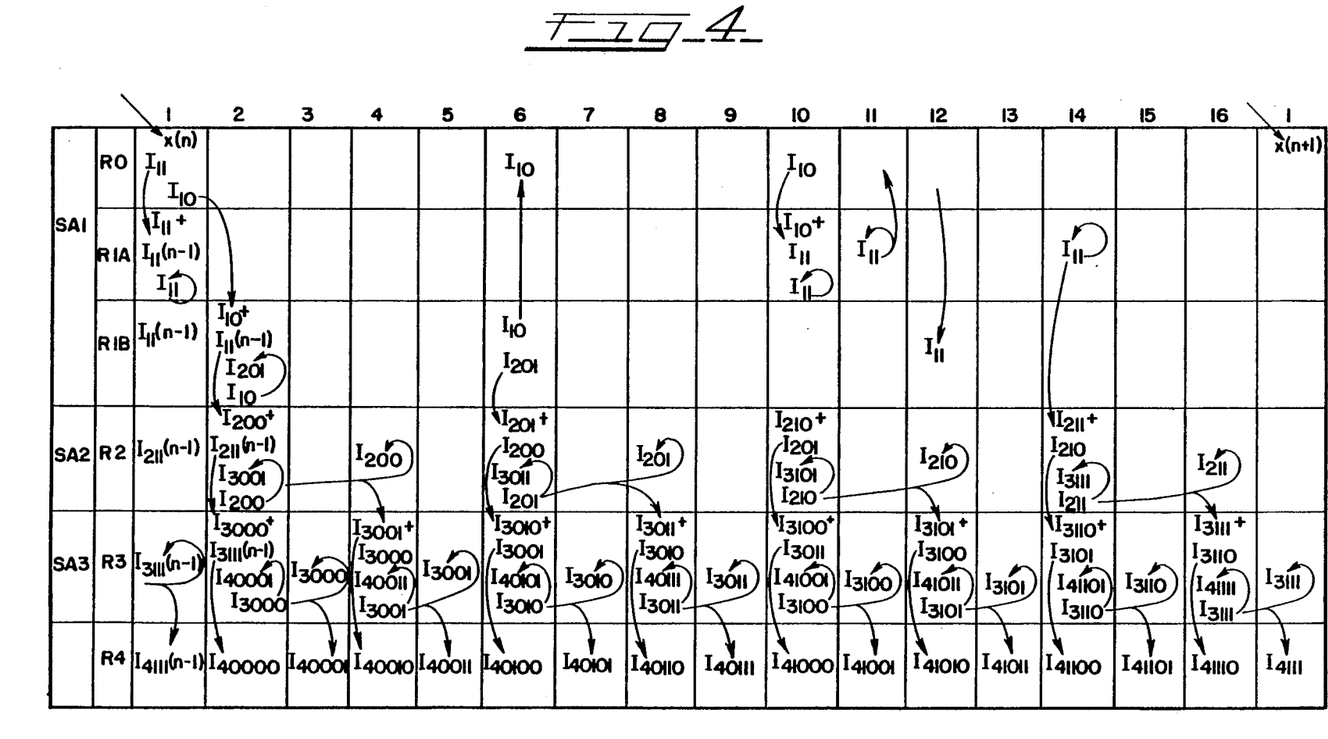
FIG. 4 is a space-time domain matrix representation of the decimation-interpolation circuit of the present invention for implementation of the interpolation transfer function.

The decimation-interpolation circuit 18 effects interpolation as illustrated in FIG. 4. Prior to the arrival of a sample x(n), the previous sample x(n−1) resides in shift registers R1A, R1B, R2, and R3. This situation occurs directly as a result of the computational scheme and, following the generation of 16 outputs from one input sample x(n), the sample x(n) will be held in shift registers R1A, R1B, R2, and R3.

This situation simplifies the structure of decimation-interpolation circuit 18 because as may be ascertained by inspection, $I_{11}(n-1)=x(n-1)$ and is required to compute $I_{10}(n)$. Similarly, $I_{200}(n)$ requires $I_{11}(n-1)$, for computation; and
$I_{3000}(n)$ requires $I_{211}(n-1)$, i.e., $I_{11}(n-1)$: and
$I_{40000}(n)$ requires $I_{3111}(n-1)$, i.e., $I_{211}(n-1)$, i.e., $I_{11}(n-1)$ Referring to FIG. 4, columnar divisions of the matrix are delineated at the top of the matrix in time periods 1–16 and 1, indicating the first clock pulse in the next cycle. Each period is one clock pulse in duration. Row divisions are representative of the various registers R0, R1A, R1B, R2, R3, and R4 with associated serial adders SA1, SA2, and SA3 within the decimation-interpolation circuit 18.

Accordingly, each box in the matrix of FIG. 4 represents the function(s) performed by a specific register and serial adder during a specific time period.

Referring to FIG. 4, during period sample x(n) is loaded in register R0 from output bus 24b via line 26 and multiplexer 74, the contents of register R1A (sample x(n−1)) and the contents of register R0 (sample x(n)) are added in serial adder SA1 and the result of that summation, which is $I_{10}$, is shifted into register R0. x(n), which is $I_{11}$, is written back into register R1A.

Thus, there resides at this point in time within register R1A the sample x(n), which is also interpolation factor $I_{11}(n)$. The "one-half" factor required to compute certain of the interpolation factors (such as, $I_{10}(n)$, $I_{200}(n)$, and so on) is provided by clocking control. That is, when a "one-half" factor is required for an interpolation factor calculation, the elements of that calculation are combined as required and stored in a register. Then the elements are shifted one place to the right (i.e., ÷2) prior to completion of the calculation of that respective interpolation factor. In such manner, the least significant adder output bit is lost and the second least significant output bit becomes the least significant output bit, i.e., ÷2.

There is a symmetry about FIG. 4 which, however, does not extend to the operation of adder SA1. There is a pipelining of computations to ensure that the next required computation to be performed by adder SA1 occurs in period 2. This results in the first interpolation factor ($I_{40000}$) actually being shifted into register R4 during period 2. If adder SA1 were employed during period 1 to perform the calculations necessary to produce $I_{40000}$ during period 1, then adder SA1 would need to operate at a frequency greater than 10 MHz.

By pipelining calculations, as illustrated in FIG. 4, the last interpolation factor ($I_{41111}(n-1)$) for the previous cycle, which requires no calculations be performed by adder SA1, is shifted into register R4 during period 1.

Thus, adder SA1 may be operated at the same speed as adders SA2 and SA3, preferably yielding an interpolator output period of approximately 3.9 μ sec.

Continuing in FIG. 4, during time period 2, the register R1B contents ($I_{11}(n-1)$) are added with the contents of register R0 ($I_{10}$), appropriately scaled, to calculate interpolation factor $I_{200}$, and $I_{200}$ is shifted to register R2. Further during time period 2, the contents of register R2 ($I_{211}(n-1)=I_{11}(n-1)$) are combined with $I_{200}$ by adder SA2 to produce $I_{3000}$ and that result is shifted to register R3. Adder SA3 combines $I_{3000}$ with the contents of register R3 ($I_{3111}(n-1)=I_{11}(n-1)$ which has remained in register R3 since the previous calculation cycle) to calculate $I_{40000}$, and $I_{40000}$ is shifted to register R4 during period 2.

During period 2, $I_{10}/I_{201}$ is rewritten into register R1B, $I_{200}/I_{3001}$ is rewritten into register R2, and $I_{3000}/I_{40001}$ is rewritten into register R3.

During time period 3 in FIG. 4, register R1A continues to store sample x(n) (also $I_{11}$), register R1B is storing $I_{10}/I_{201}$, register R2 is storing $I_{200}/I_{3001}$, register R3 writes $I_{40001}$ (which is also $I_{3000}$) into register R4, and $I_{3000}/I_{40001}$ is rewritten into register R3.

During time period 4 in FIG. 4, register R1A continues to retain $I_{11}$ in storage. Adder SA3 combines $I_{3001}$ from register R2 with $I_{3000}$ from register R3 to calculate $I_{40010}$, with appropriate scaling by right-shifting as previously described. $I_{3001}/I_{40011}$ is rewritten into register R3 and $I_{200}$ is rewritten into register R2.

During time period 5 in FIG. 4, register R1A continues to store $I_{11}$, register R3 shifts $I_{3001}/I_{40011}$ to register R4, and $I_{3001}$ is rewritten into register R3.

During the sixth time period illustrated in FIG. 4, interpolation factor $I_{10}/I_{201}$ is shifted to shift register R0 in order that the factor $I_{10}$ will be available for subsequent computation of $I_{210}$ (later, in time period 10). Further, in time period 6, the then-contents of register R2 ($I_{200}$) are combined with the output of first digital cell circuit 68 ($I_{201}$ clocked from shift register R1B) by adder SA2 to produce $I_{3010}$. $I_{3010}$ is combined by serial adder SA3 with the then-contents of register R3 ($I_{3001}/I_{40011}$) to yield $I_{40100}$. $I_{3011}/I_{201}$ is rewritten to register R2 and $I_{3010}/I_{40101}$ is rewritten to register R3.

During time period 7, $I_{40101}$ is written from register R3 into register R4, and is also rewritten to register R3.

In time period 8, serial adder SA3 combines $I_{3011}$ from register R2 with the then-existing contents of register R3 ($I_{3010}$) to produce $I_{40110}$. Also during period 8, $I_{201}/I_{3011}$ is rewritten to register R2, $I_{3011}/I_{40111}$ is rewritten to register R3, and $I_{40110}$ is written to register R4.

In time period 9, $I_{40111}$ is written into register R4 and is rewritten to register R3 for later use.

In time period 10, the contents of register R0 ($I_{10}$), written into register R0 during time period 6, are combined by adder SA1 with the contents of register R1A ($I_{11}$) to produce $I_{210}$ which is, in turn, combined by adder SA2 with the then-contents of register R2 ($I_{201}$) to produce $I_{3100}$. $I_{11}$ is rewritten to register R1A. $I_{3100}$ is combined by adder SA3 with the then-contents of register R3 ($I_{3011}$) to produce $I_{41000}$, and $I_{41000}$ is written to register R4. Also during period 10, $I_{3100}/I_{41001}$ is rewritten to register R3, and $I_{210}/I_{3101}$ is rewritten to register R2.

During period 11, $I_{11}$ is written from register R1A to register R0 and also rewritten to register R1A. Also during period 11, $I_{41001}$ is written to register 4 and $I_{3100}/I_{41001}$ is rewritten into register R3.

In time period 12, the contents of register R0 ($I_{11}$) are written to register R1B for further use during the next pass. Adder SA3 combines $I_{3101}$ with the then-contents of register R3 ($I_{3100}$) to produce $I_{41010}$. Also during period 12, $I_{210}/I_{3101}$ is rewritten to register R2, $I_{3101}/I_{41011}$ is rewritten to register R3, and $I_{41010}$ is written to register R4.

During period 13, $I_{41011}$ is written to register R4; and $I_{3101}/I_{41011}$ is rewritten to register R3.

During period 14, adder SA2 receives $I_{11}/I_{211}$ from register R1A and combines $I_{211}$ with the then-contents of register R2 ($I_{210}$) to produce $I_{3110}$. Adder SA3 receives $I_{3110}$ from register R2 and combines $I_{3110}$ with the then-existing contents of register R3 ($I_{3101}$) to produce $I_{41100}$ and writes $I_{41100}$ to register R4. Also during period 14, $I_{11}$ is rewritten to register R1A, $I_{211}/I_{3111}$ is rewritten to register R2, and $I_{3110}/I_{41101}$ is rewritten to register R3.

During time period 15, $I_{41101}$ is written into register R4; and $I_{3110}/I_{41101}$ is rewritten into register R3.

During period 16, adder SA3 receives $I_{211}/I_{3111}$ from register R2 and combines $I_{211}/I_{3111}$ with the then-contents of register R3 ($I_{3110}$) to produce $I_{41110}$ and writes $I_{41110}$ to register R4. Also during period 16, $I_{211}/I_{3111}$ is rewritten to register R2, and $I_{3111}/I_{41111}$ is rewritten to register R3.

During time period 1 of the next (x(n+1)) cycle, $I_{41111}$ is written to register R4 and $I_{3111}/I_{41111}$ is rewritten into register R3. At the same time, register R0 receives the next sample, x(n+1), for interpolation.

Consequently, registers R1A, R1B, R2, and R3 all now contain x(n) available for computations during the next pass when sample x(n+1) is interpolated in the subsequent cycle.

Further, the sixteen interpolation samples have been generated from the one original sample x(n) and have been passed to register R4 from which they may be clocked through multiplexer 94 via line 28 to analog-digital-analog device 14 for conversion to an outgoing analog signal as previously described.

Figure 5:
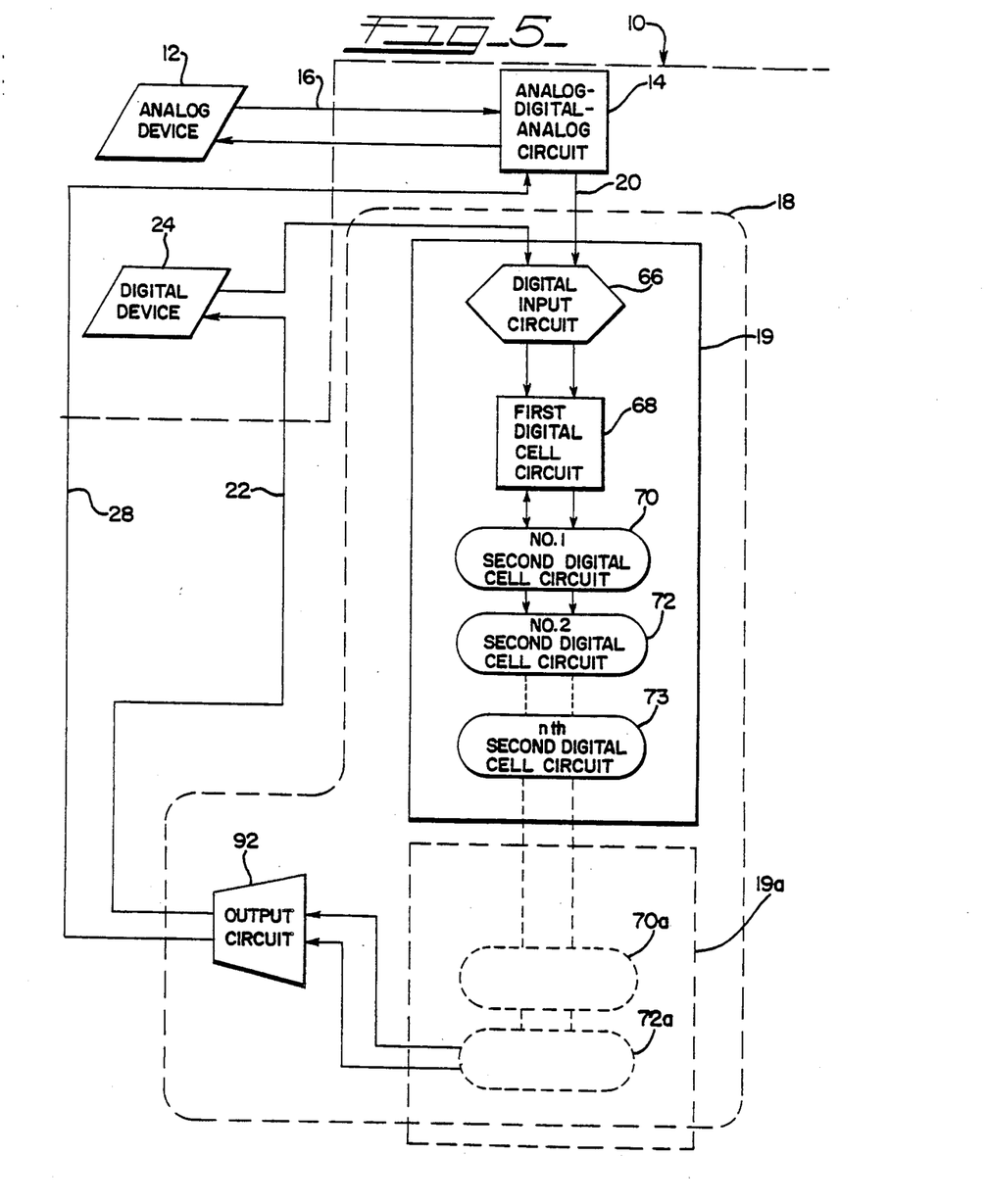
FIG. 5 is a schematic block diagram illustrating the modular design of the preferred embodiment of the present invention.

Referring to FIG. 5, a schematic block diagram illustrating the modular design of the preferred embodiment of the present invention is presented. In FIG. 5, an analog device 12 sends incoming analog signals via a line 16 to an apparatus 10, and specifically to an analog-digital circuit 14 within the apparatus 10. The analog-digital-analog circuit 14 passes incoming digital signals to a decimation-interpolation circuit 18 via line 20.

The decimation-interpolation circuit 18 is comprised of decimator-interpolator module 19. Additional decimator-interpolator modules may be added to effect further decimation or interpolation as desired; such additional optional decimator-interpolator modules are represented in FIG. 5 by the dotted-line representation for decimator-interpolator module 19a. The decimator-interpolator module 19 is comprised of a digital input circuit 66, a first digital cell circuit 68, and second digital cell circuits 70, 72, 73. Second digital cell circuits within a given decimator-interpolator module 19 may be added to effect greater degrees of decimation or interpolation as desired, as indicated by second digital cell circuits 72 and 73. Additional decimator-interpolator modules 19a necessarily will contain second digital cell circuits 70a and 72a; the number of second digital cell circuits 70a, 72a need not be identical among the various decimator-interpolator modules 19, 19a.

The last of the second digital cell circuits 73 in the decimator-interpolator module 19 provides input to second digital cell circuit 70a of a subsequent decimator-interpolator module 19a.

The last second digital cell circuit 72a of the last decimator-interpolator module 19a provides outputs to output circuit 92 from which decimated incoming digital signals are passed via line 22 to digital device 24 and interpolated digital signals are passed to analog-digital-analog circuit 14 via line 28.

It is to be understood that, while the detailed drawings and specific examples given describe preferred embodiments of the invention, they are for the purpose of illustration only, that the apparatus of the invention is not limited to the precise details and conditions disclosed, and that various changes may be made therein without departing from the spirit of the invention which is defined by the following claims.

We claim:

1. An apparatus adaptable for use in effecting communications between an analog device and a digital device, the apparatus comprising:

an analog-digital-analog means for converting analog signals to digital signals and for converting digital signals to analog signals; and a decimator-interpolator means for decimating incoming digital signals received from said analog-digital-analog means and providing decimated incoming digital signals representative of said incoming digital signals to said digital device, and for interpolating outgoing digital signals received from said digital device and providing interpolated digital signals to said analog-digital-analog means;

said analog-digital-analog means converting incoming analog signals received from said analog device into said incoming digital signals, said incoming digital signals being representative of said incoming analog signals, and converting said interpolated digital signals into outgoing analog signals, said outgoing analog signals being representative of said interpolated digital signals and being provided to said analog device;

said analog-digital-analog means including a single digital-to-analog converter, a first group of switches, and a second group of switches;

said digital-to-analog converter, said first group of switches, and said second group of switches being operatively connected whereby closing said first group of switches, while keeping said second group of switches open, configures said analog-digital-analog means for delivering said incoming digital signals to said decimator-interpolator means, and whereby closing said second group of switches, while keeping said first group of switches open, configures said analog-digital-analog means for receiving said interpolated digital signals from said decimator-interpolator means;

said decimator-interpolator means comprising a first decimator-interpolator module, and an output means for providing digital outputs, said first decimator-interpolator module comprising a digital input circuit, a first digital cell circuit, and a second digital cell circuit;

said digital input circuit selectively receiving said incoming digital signal from said analog-digital-analog means and producing an incoming clocked input to said first digital cell circuit, or receiving said outgoing digital signal from said digital device and producing an outgoing clocked input to said first digital cell circuit;

said first digital cell circuit selectively producing a first iteration decimated digital signal to said second digital cell circuit in response to reception of said incoming clocked digital signal, or producing a first iteration interpolated digital signal to said second digital cell circuit in response to reception of said outgoing clocked input;

said second digital cell circuit selectively producing a second iteration decimated digital signal in response to reception of said first iteration decimated digital signal, or producing a second iteration interpolated digital signal in response to reception of said first iteration interpolated digital signal;

the products of said second digital cell circuit being the outputs of said first decimator-interpolator module;

said second digital cell circuit being operatively connected to provide its respective outputs to said output means;

said output means selectively providing said interpolated digital signal to said analog-digital-analog means or providing said decimated incoming digital signal to said digital device, in response to settings of said first group of switches and said second group of switches.

2. An apparatus adaptable for use in effecting communications between an analog device and a digital device as recited in claim 1 wherein said digital input circuit includes a shift register and programmable logic array means for producing said incoming clocked input.

3. An apparatus adaptable for use in effecting communications between an analog device and a digital device as recited in claim 1 wherein said analog-digital-analog means further includes modulating means for comparing said incoming analog signal with a feedback output from said digital-to-analog converter and producing a digital modulator output, said digital modulator output indicating the relative levels of said incoming analog signal and said feedback output.

4. An apparatus adaptable for use in effecting communications between an analog device and a digital device as recited in claim 3 wherein said digital input circuit includes a shift register and programmable logic array means for producing said incoming clocked input.

5. An apparatus adaptable for use in effecting communications between an analog device and a digital device as recited in claim 1, wherein said decimator-interpolator means further comprises a second decimator-interpolator module;

said second decimator-interpolator module comprising a secondary digital cell circuit;

said second decimator-interpolator module receiving as its input said outputs of said first decimator-interpolator module;

said second decimator-interpolator module receiving as its input said outputs of said first decimator-interpolator module and the products of said second decimator-interpolator module being operatively connected to said output means.

6. An apparatus adaptable for use in effecting communications between an analog device and a digital device as recited in claim 5 wherein said digital input circuit includes a shift register and programmable logic array means for producing said incoming clocked input.

7. An apparatus adaptable for use in effecting communications between an analog device and a digital device as recited in claim 5, wherein said secondary digital cell circuit comprises a plurality of secondary digital circuits.

said plurality of secondary digital circuits being arranged serially whereby each of said plurality of secondary digital circuits after a first of said plurality of secondary digital circuits receives as its respective input the output of the next preceding of said plurality of secondary digital circuits;

each succeeding of said plurality of secondary digital circuits selectively producing an n+1 iteration decimated digital signal in response to reception of an nth iteration decimated digital signal, or producing an n+1 iteration interpolated signal in response to receiving an nth iteration interpolated digital signal.

8. An apparatus adaptable for use in effecting communications between an analog device and a digital device as recited in claim 1 wherein said second digital cell circuit comprises a plurality of second digital circuits;

said plurality of second digital circuits being arranged serially whereby each of said plurality of second digital circuits after a first of said plurality of second digital circuits receives as its respective input the output of the next preceding of said plurality of second digital circuits;

each succeeding of said plurality of second digital circuits selectively producing an n+1 iteration decimated digital signal in response to reception of an nth iteration decimated digital signal, or producing an n+1 iteration interpolated digital signal in response to receiving an nth iteration interpolated digital signal;

products of the last of said plurality of second digital circuits being the outputs of said first decimator-interpolator module;

said last of said plurality of second digital circuits being operatively connected to provide its respective outputs to said output means.

9. An apparatus adaptable for use in effecting communications between an analog device and a digital device as recited in claim 8 wherein said decimator-interpolator means further comprises a second decimator-interpolator module;

said second decimator module comprising a secondary digital cell circuit;

said second decimator-interpolator module receiving as its input said outputs of said first decimator-interpolator module;

the products of said second decimator-interpolator module being operatively connected to said output means.

10. An apparatus adaptable for use in effecting communications between an analog device and a digital device as recited in claim 8 wherein said decimator-interpolator means further comprises a plurality of second decimator-interpolator modules;

each of said plurality of second decimator modules comprising a secondary digital cell circuit;

said plurality of second decimator-interpolator modules being arranged serially whereby a first of said plurality of second decimator-interpolator modules receives as its input said outputs of said first decimator-interpolator module, and each of said plurality of second decimator-interpolator modules after said first of said plurality of second decimator-interpolator modules receives as its respective input the output of the next preceding of said plurality of second decimator interpolator modules;

the products of the last of said plurality of second decimator-interpolator modules being operatively connected to said output means.

11. An apparatus adaptable for use in effective communications between an analog device and a digital device as recited in claim 10, wherein said secondary digital cell circuit comprises a plurality of secondary digital circuits.

said plurality of secondary digital circuits being arranged serially whereby each of said plurality of secondary digital circuits after a first of said plurality of secondary digital circuits receives as its respective input the output of the next preceding of said plurality of secondary digital circuits;

each succeeding of said plurality of secondary digital circuits selectively producing an n+1 iteration decimated digital signal in response to reception of an nth iteration decimated digital signal, or producing an n+1 iteration interpolated signal in response to receiving an nth iteration interpolated digital signal.

12. An apparatus adaptable for use in effecting communications between an analog device and a digital device as recited in claim 1 wherein said decimator-interpolator means further comprises a plurality of second decimator-interpolator modules;

each of said plurality of second decimator modules comprising a secondary digital cell circuit;

said plurality of second decimator-interpolator modules being arranged serially whereby a first of said plurality of second decimator-interpolator modules receives as its input said outputs of said first decimator-interpolator module, and each of said plurality of second decimator-interpolator modules after said first of said plurality of second decimator-interpolator modules receives as its respective input the output of the next preceding of said plurality of second decimator interpolator modules;

the products of the last of said plurality of second decimator-interpolator modules being operatively connected to said output means.

13. An apparatus adaptable for use in effecting communications between an analog device and a digital device, the apparatus comprising:

an analog-digital-analog means for converting incoming analog signals received from said analog device to incoming digital signals and for converting interpolated outgoing digital signals originating from said digital device to outgoing analog signals; and a digital signal processing means for decimating incoming digital signals and providing a decimated incoming digital signal to said digital device, and for interpolating outgoing digital signals received from said digital device and providing said interpolated outgoing digital signal to said analog-digital-analog means;

said analog-digital-analog means including a single digital-to-analog converter and switching means for determining the functional structure of said analog-digital-analog means;

said switching means having at least two orientations, including a first orientation whereby said digital-to-analog converter is used to effect said converting of incoming analog signals to incoming digital signals, and including a second orientation whereby said digital-to-analog converter is used to effect said converting of interpolated outgoing digital signals to outgoing analog signals.

14. An apparatus adaptable for use in effecting communications between an analog device and a digital device as recited in claim 13 wherein said digital signal processing means comprises a plurality of modules, said plurality of modules being configured whereby a specified set of said plurality of modules effects a specified number of iterations of said decimation and a specified number of iterations of said interpolation; certain of said specified set of modules participating in both said decimation and said interpolation.

15. An apparatus adaptable for use in effecting communications between an analog device and a digital device as recited in claim 14 wherein the apparatus is configured to accommodate operative connection of additional modules of said plurality of modules to said specified set to selectively increase said iterations of said decimation or to increase said iterations of said interpolation.

16. An apparatus adaptable for use in effecting communications between an analog device and a digital device as recited in claim 15 wherein addition of said additional modules increases both said iterations of said decimation and said iterations of said interpolation.

* * * * *